(12) United States Patent
Masuda et al.

(10) Patent No.: US 8,913,206 B2
(45) Date of Patent: Dec. 16, 2014

(54) DEVICE AND DISPLAY UNIT

(75) Inventors: Kenta Masuda, Kanagawa (JP); Yuichi Kato, Kanagawa (JP); Keiichi Akamatsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 78 days.

(21) Appl. No.: 13/457,711

(22) Filed: Apr. 27, 2012

(65) Prior Publication Data

US 2012/0293760 A1 Nov. 22, 2012

(30) Foreign Application Priority Data

May 19, 2011 (JP) .................................. 2011-112315

(51) Int. Cl.
*G02F 1/133* (2006.01)
*H01L 27/12* (2006.01)

(52) U.S. Cl.
CPC ................................... *H01L 27/1218* (2013.01)
USPC ........................................................... 349/43

(58) Field of Classification Search
USPC ........................... 349/43, 106, 39; 257/59, 72
See application file for complete search history.

(56) References Cited

U.S. PATENT DOCUMENTS

| 5,412,493 | A  | * | 5/1995  | Kunii et al. ..................... 349/43  |
| 5,818,550 | A  | * | 10/1998 | Kadota et al. ................... 349/43  |
| 6,692,983 | B1 | * | 2/2004  | Chen et al. ...................... 438/70  |
| 7,436,463 | B2 | * | 10/2008 | Yamazaki ........................ 349/43  |
| 8,107,038 | B2 | * | 1/2012  | Kim et al. ..................... 349/106  |

FOREIGN PATENT DOCUMENTS

JP 2000-164874 A 6/2000

* cited by examiner

*Primary Examiner* — James Dudek
(74) *Attorney, Agent, or Firm* — Sony Corporation (57) ABSTRACT

A device includes a substrate, a metal layer being formed in a region on a part of the substrate, and a first insulating film being provided on the substrate and the metal layer and including a trench provided at a position corresponding to a part or all of a region where the metal layer is not provided.

12 Claims, 10 Drawing Sheets

FIG. 11

DEVICE AND DISPLAY UNIT

BACKGROUND

The present disclosure relates to a device such as a thin film transistor (TFT), and a display unit provided with the device.

In related art, since devices such as TFTs are typically formed on a glass substrate, stress or the like of an insulating film is not considered important. In addition, Japanese Unexamined Patent Application Publication No. 2000-164874, for example, discloses a manufacturing method for a TFT in which a manufacturing process of a contact hole is omitted in order to reduce cost, and this method is widely used at present.

SUMMARY

In recent years, in display units including liquid crystal display units, organic EL display units, electrophoretic display units, and the like, a thinner and more lightweight display unit is desired. In order to make a display unit thinner and lightweight, it may be possible to reduce the thickness of a glass substrate of a supporting body or, adopt a substrate having flexibility such as plastic substrates.

However, there has been an issue that, when an insulating film having high stress is formed on such a substrate, the stress of the film may cause film peel-off and destruction of the substrate, resulting in a reduced yield.

It is desirable to provide a device in which the stress of an insulating film formed on a substrate is reduced to improve the yield, and a display unit provided with the device.

A device according to an embodiment of the present disclosure includes: a substrate; a metal layer being formed in a region on a part of the substrate; and a first insulating film being provided on the substrate and the metal layer and including a trench provided at a position corresponding to a part or all of a region where the metal layer is not provided.

A display unit according to an embodiment of the present disclosure includes: a device; and a display layer, the device and the display layer being provided above a substrate. The device includes a metal layer being formed in a region on a part of the substrate, and a first insulating film being provided on the substrate and the metal layer and including a trench provided at a position corresponding to a part or all of a region where the metal layer is not provided.

In the device and the display unit according to the embodiments of the present disclosure, in the first insulating film formed on the substrate with the metal layer formed in the region on the substrate in between, the trench is provided in a part or all of the region where the metal layer is not provided, so that the stress of the first insulating film is reduced.

In the device and the display unit according to the embodiments of the present disclosure, in the first insulating film provided on the substrate with the metal layer in between, the trench is provided in a part or all of the region where the metal layer is not provided, so that the stress of the first insulating film is reduced. As a result, the occurrence of film peel-off of the first insulating film or the like from the substrate is suppressed, and hence the yield is improved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

An embodiment of the present disclosure will be described in detail below referring to the figures. It is to be noted that, description will be made in the following order.
1. Embodiment
   Display unit in which a first insulating film provided on a substrate with a metal layer in between includes a trench
2. Modification 1
   Display unit in which a second insulating film is provided between the first insulating film and a third insulating film
3. Modification 2
   Display unit in which a display layer is directly provided on the second insulating film
4. Application Example

1. Embodiment

Configuration of Display Unit 1

Figure 1:
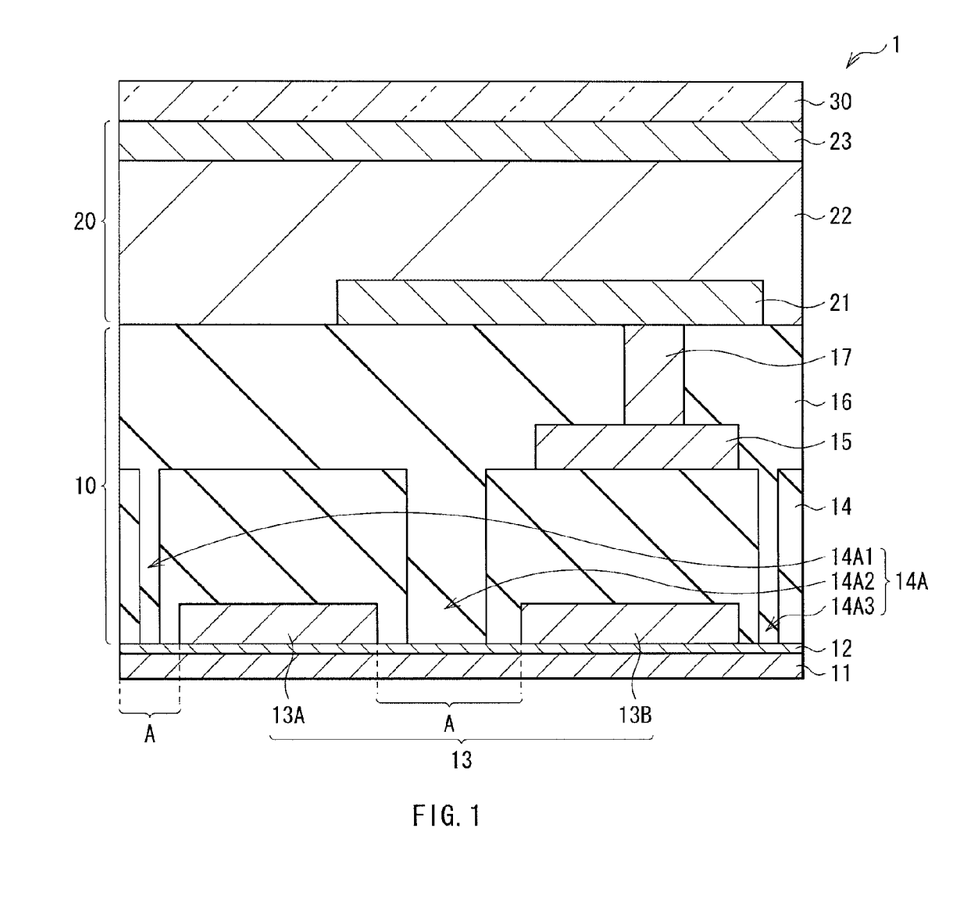
FIG. 1 is a sectional view illustrating a configuration of a display unit according to an embodiment of the present disclosure.

FIG. 1 illustrates a cross-sectional configuration of a display unit 1 according to an embodiment of the present disclosure. For example, the display unit 1 is an electrophoretic display (so-called electronic paper display) that displays an image (letter information or the like, for example) by utilizing electrophoresis, and the display unit 1 has a configuration in which a TFT layer 10 and a display layer 20 are laminated on a substrate 11. It is to be noted that, FIG. 1 schematically illustrates a structure of the display unit 1, and may differ from actual dimension and form.

The substrate 11 supports the TFT layer 10 and the display layer 20, and has flexibility. Specifically, for example, the substrate 11 is made of an inorganic material such as glass, quartz, silicon, and gallium arsenide, a plastic material such as polyimide, polyethylene terephthalate (PET), polyethylene naphthalate (PEN), polymethyl methacrylate (PMMA), polycarbonate (PC), polyether sulfone (PES), polyether ether ketone (PEEK), and aromatic polyester (liquid crystal polymer), or the like material. In addition, the substrate 11 need only to have a certain degree of thickness, and specifically, it is preferable that the substrate 11 have a thickness of 1 μm to 700 μm, for example.

A bather layer 12 prevents degradation of the TFT layer 10 and the display layer 20 caused by water and organic gas, and the barrier layer 12 is made of silicon oxide ($SiO_2$), silicon nitride ($Si_3N_4$), aluminum oxide ($Al_2O_3$), aluminum nitride (AlN), tantalum oxide ($Ta_2O_5$), or aluminum oxynitride ($AlO_xN_{1-x}$ (provided that X=0.01 to 0.2)), for example. The barrier layer 12 may be formed with use of a CVD apparatus, an ALD (Atomic Layer Deposition) apparatus, a PLD (Pulsed Laser Deposition) apparatus, a sputtering apparatus, an EB deposition apparatus, an ion plating apparatus, or the like.

Figure 2A:
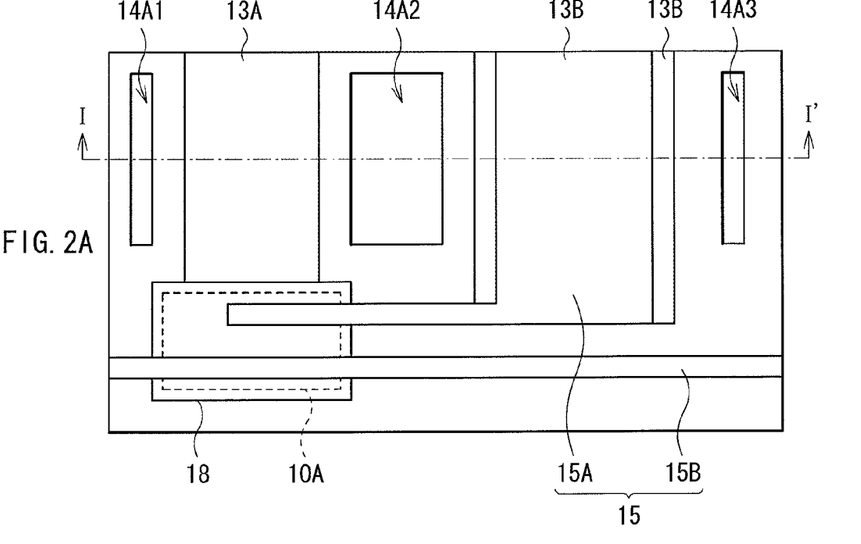
FIGS. 2A and 2B are a plan view and a sectional view, respectively, each illustrating a part of a TFT layer in the display unit shown in FIG. 1.
Figure 2B:
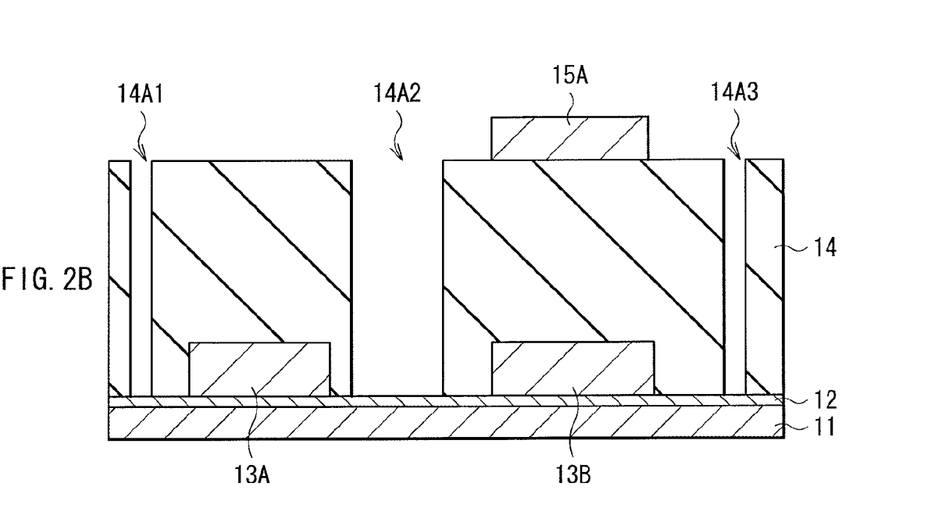

The TFT layer 10 is a layer which has a plurality of devices including thin films (a metal layer such as an electrode, an insulating film, and the like). Specifically, the TFT layer 10 includes, in addition to a TFT as a switching element configured to select pixels, a capacitive element (holding capacitive element or the like), a wiring (scan line, signal line, or the like), an electrode (pixel electrode or the like), and the like. That is, the TFT layer 10 includes one or more of the TFT, the capacitive element, the wiring, and the electrode. It is to be noted that, the above-mentioned TFT may be configured either of an organic TFT using an organic semiconductor layer or an inorganic TFT using an inorganic semiconductor layer as a channel layer 10A (FIG. 2).

In the TFT layer 10 of the present embodiment shown in FIG. 1, a first insulating film 14 is provided on a metal layer 13. Further, a metal layer 15 (an electrode corresponding to a capacitive electrode 13B) is provided on the first insulating film 14 in a region opposite to the capacitive electrode 13B, and a third insulating film 16 is provided on the entire surface of the first insulating film 14 and the metal layer 15.

In this case, for example, the metal layer 13 is a gate electrode 13A and the capacitive electrode 13B of the lower one of a pair of electrodes of the capacitive element, whereas the metal layer 15 is a capacitive electrode of the upper one of the pair of capacitive electrodes of the capacitive element. Each of the metal layers 13 and 15 is configured of a single-layer film made of one of commonly-used conductive materials such as molybdenum (Mo), chromium (Cr), tantalum (Ta), titanium (Ti), aluminum (Al), an aluminum alloy, and the like, or a laminated film made of two or more of these materials. It is to be noted that, an example of the aluminum alloy is an aluminum-neodymium alloy. It is to be noted that, although not shown in the figure, the metal layer 15 includes source and drain electrodes.

The first insulating film 14 protects the metal layer 13 (the gate electrode 13A and the capacitive electrode 13B), and also prevents short circuit of the gate electrode 13A, the capacitive electrode 13B, the metal layer (capacitive electrode) 15, and the source and drain electrodes. The first insulating film 14 is configured of a single-layer film made of one of $SiO_2$, $Si_3N_4$, SiNO, $Al_2O_3$, and the like, for example. Although the film thickness of the first insulating film 14 is not specifically limited, 100 to 500 nm, for example, is preferable in order to maintain the insulation property between electrodes. It is to be noted that, the material of the first insulating film 14 is not limited to the above-mentioned inorganic materials, and organic materials, such as PVA (polyvinyl alcohol), PVP (polyvinyl phenol), a novolac resin, an acrylic resin, and a fluorine-based resin may be used.

In the present embodiment, the first insulating film 14 is provided with a trench 14A in a region (metal layer unformed region A) where the metal layer 13 is not formed. Specifically, the trench 14A is formed in a part or all of a region except for a region where the metal layer 13 is formed and the outer periphery of the first insulating film 14. Consequently, the stress of the first insulating film 14 is moderated.

FIG. 2A is a plan view illustrating a configuration of a part of the TFT layer 10 of the display unit 1 according to the present embodiment, and FIG. 2B is a cross-sectional view illustrating a configuration taken along I-I' line of FIG. 2A. In this instance, the trenches 14A are provided between the gate electrode 13A and the outer periphery section (14A1), between the gate electrode 13A and the capacitive electrode 13B (14A2), and between the capacitive electrode 13B and the outer periphery section (14A3). The depth of the trench 14A (the laminating direction of the first insulating film 14) is not specifically limited, but preferably, the depth is equivalent to the thickness of the first insulating film 14. The trench 14A may penetrate the first insulating film 14. In particular, when the trench 14A is configured to penetrate the first insulating film 14, it is possible to effectively reduce the stress of the first insulating film 14. In addition, preferably, the width (in the horizontal direction of the first insulating film 14) of the trench 14A is, for example, 4 μm or more. It is to be noted that, desirably, lateral faces of each metal layer 13 are covered by the first insulating film 14 with a thickness of about 4 μm or more in order to prevent short circuit. In addition, the trench 14A is filled with the third insulating film 16 described later.

The third insulating film 16 is a protective film configured to protect or planarize the channel layer 10A, a capacitive layer, and the like of the TFT. Also, the third insulating film 16 is a protective film on which the display layer 20 is to be provided. The third insulating film 16 is preferably made of an alkyl resin material having photosensitivity, for example. In addition, it is also possible to use non-photosensitive organic materials such as PVA (polyvinyl alcohol), PVP (polyvinyl phenol), a novolac resin, an acrylic resin, and a fluorine-based resin. The film thickness of the third insulating film 16 ranging from the upper surface of the first insulating film 14, except for the trench 14A, is, for example, 1 μm to 4 μm, but this is not limitative. It is to be noted that, the film property of the first insulating film 14 and a third insulating film 16 is not specifically limited, and they may have substantially equivalent film property, for example, substantially equal film density, or they may have film density different from each other.

It is to be noted that, the second insulating film 18 is provided on the above-mentioned channel layer 10A. The second insulating film 18 is a protective film that protects the channel layer 10A of the TFT, and relates to the reliability of switching characteristics of the TFT. The second insulating film 18 is configured of, for example, a single-layer film made of one of $SiO_2$, $Si_3N_4$, SiNO, $Al_2O_3$, and the like, or a laminated film made of two or more of these materials. The thickness of the second insulating film 18 is, for example, 50 to 350 nm, but this is not limitative. In addition, the material of the second insulating film 18 is not limited to the above-mentioned inorganic materials, and organic materials such as PVA (polyvinyl alcohol), PVP (polyvinyl phenol), a novolac resin, an acrylic resin, and a fluorine-based resin may be used. It is to be noted that, although, in this instance, the second insulating film 18 is formed only on the channel layer 10A in order to moderate the stress in the TFT layer 10, the second insulating film 18 may be provided over the entire face without being limited onto the channel layer 10A, as described later.

The display layer 20 has a structure in which, for example, an electrophoretic layer 22 having electrophoretic particles is sandwiched between a pixel electrode 21 and a common electrode 23. That is, the display unit 1 is an electrophoretic display that utilizes electrophoresis to display an image (letter information or the like, for example). The pixel electrode 21 is provided in the TFT layer 10 on a pixel-by-pixel basis, and the common electrode 23 is provided over the entire surface of a transparent substrate 30. The pixel electrode 21 and the metal layer 15 of the TFT layer 10 are connected by a penetrating electrode 17. It is to be noted that, the pixel electrode 21 and the penetrating electrode 17 may be simultaneously formed with use of the material of the pixel electrode 21.

For example, the electrophoretic particles include two types: those configured of white pigment such as titanium dioxide and those configured of black pigment such as carbon black and aniline black.

The transparent substrate 30 is made of, for example, a material similar to that of the substrate 11. It is possible to additionally provide, on the transparent substrate 30, a damp-proof film that prevents water from infiltrating into the display layer 20 and an optical functional film that prevents external light from reflecting on the display face.

A manufacturing method of the display unit 1 of the present embodiment will be described below.

(Manufacturing Method of Display Unit 1)

For example, the display unit 1 is manufactured in the following manner. Specifically, first, the barrier layer 12 made of $SiO_2$, SiN, or the like is formed on the substrate 11 (specifically, on a display region of the substrate 11) by, for example, a CVD (chemical vapor deposition) method or a sputtering method, and thereafter, the TFT layer 10 including various kinds of devices is formed by using a photolithographic technique described later. Next, in a similar manner, the display layer 20 is formed on the TFT layer 10 by using a photolithographic technique, for example. Thereafter, the transparent substrate 30 is bonded on the display layer 20. In this manner, the display unit 1 shown in FIG. 1 is completed. It is also possible that the electrophoretic layer 22 is formed after the common electrode 23 is formed on the transparent substrate 30, and then the display layer 20 in which an adhesive layer (not illustrated) is provided on the surface of the electrophoretic layer 22 is bonded to the TFT layer 10.

(Manufacturing Method of TFT Layer 10)

Figure 3:
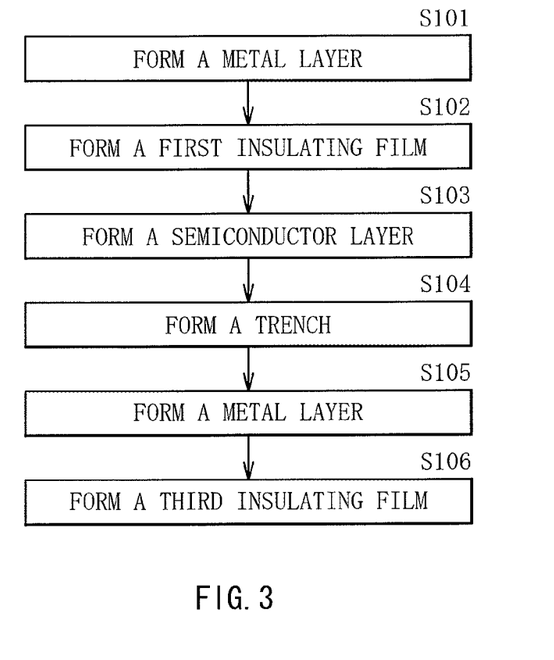
FIG. 3 is a flow chart illustrating a manufacturing process of the display unit shown in FIG. 1.

Here, FIG. 3 is a flow chart illustrating an exemplary main process of a manufacturing method (device forming process) of the TFT layer 10.

First, a metal film is formed on the barrier layer 12 by using a sputtering method, for example. Next, after a photoresist film is formed (applied) on this metal film, patterning is performed using a photolithography method, and then the metal layer 13 including the gate electrode 13A, the capacitive electrode 13B, and the like is formed by performing wet etching or dry etching (step S101).

Next, in such a manner as to cover the barrier layer 12 and the metal layer 13, the first insulating film 14 is formed by using a CVD method or a sputtering method, for example (step S102). Specifically, first, the first insulating film 14 made of SiN is formed by a plasma CVD method using mixed gas including silane ($SiH_4$), ammonia ($NH_3$), and nitrogen as source gas. Next, a semiconductor layer (not illustrated) is formed (step S103). Specifically, after amorphous silicon as a semiconductor material is formed by a sputtering method, patterning is performed using a photolithography method to obtain a desired form, and then a desired pattern is formed by etching or the like.

Next, in order to form a conduction portion of the metal layer 13, the first insulating film 14 is patterned by using a photolithography method (step S104). Specifically, the first insulating film 14 is patterned by etching to form a conduction portion of the metal layer 13. This etching is chemically and physically performed by, for example, dry etching or the like using fluorine-based gas. Alternatively, it is also possible to adopt wet etching or the like using chemicals such as hydrofluoric acid and the like. At this time, in the present embodiment, although it is preferable to remove the first insulating film 14 in the metal layer unformed region A serving as a non-conduction portion at the same time, as shown in FIGS. 2A and 2B, this is not limitative. Alternatively, the first insulating film 14 in the metal layer unformed region A may be separately etched.

Next, after a metal film is formed on the first insulating film 14 by using, for example, a sputtering method, patterning is performed using a photolithography method to obtain a desired form, thereby forming the metal layer 15 including the source and drain electrodes, the electrode of the capacitive element, and the like (step S105).

Next, after the channel layer 10A is formed, the second insulating film 18 is formed on the entire face of the channel layer 10A, the first insulating film 14, and the metal layer 15 (step S106) by using, particularly, a CVD method or a sputtering method, for example. Specifically, first, similarly to the formation method of the above-described first insulating film, the second insulating film 18 made of SiN or the like is created by a plasma CVD method using mixed gas including silane ($SiH_4$), ammonia ($NH_3$), and nitrogen as source gas. It should be noted that, in terms of reduction of stress, patterning is performed only on the channel layer 10A by using a photolithography method as shown in FIG. 2A.

Next, the third insulating film 16 made of a photosensitive-organic material is created on the first insulating film 14 and the metal layer 15 by using, for example, a CVD method or a sputtering method (step S106). Although a photosensitive-organic material is used in this instance, it is also possible that a non-photosensitive resin is applied and baked, and then, with use of a photolithography method, a penetrating hole to which the penetrating electrode 17 is to be provided is patterned by wet etching or dry etching using oxygen gas. In this way, a structure is obtained in which the third insulating film 16 fills also the trench 14A provided to the first insulating film 14.

Finally, the pixel electrode 21 and the penetrating electrode 17 are formed by a forming method similar to that for the metal layer 13 and the metal layer 15. In this way, the TFT layer 10 including devices such as the gate electrode 13A, the capacitive electrode 13B, and various kinds of wirings is formed. It is to be noted that, each of the pixel electrode 21 and the penetrating electrode 17 is configured of a single-layer film made of one of commonly-used conductive materials such as a transparent electrode of molybdenum (Mo), chromium (Cr), tantalum (Ta), titanium (Ti), an indium alloy including ITO, IGO, IGZO, and the like, aluminum (Al), an aluminum alloy, and the like, or a laminated film made of two or more of these materials. An example of the aluminum alloy is an aluminum-neodymium alloy.

Next, function and effect of the display unit 1 of the present embodiment will be described.

As described above, in a display unit in which a device such as a TFT is provided on a glass substrate, TFT manufacturing methods are typically used in which a forming process of a contact hole is omitted in order to reduce cost, and an unpatterned film of a gate insulating film is formed on the glass substrate provided with a gate electrode. For the purpose of maintaining the pressure resistance property of a TFT (gate electrode, in particular) and the reliability of the TFT, this gate insulating film is a dense film having high film density. This gate insulating film has a very strong stress compared with a protective film configured to protect a semiconductor layer and a planarization film. As a result, there has been an issue that, when a TFT or the like is formed on a substrate having flexibility, film cracking, film peel-off, or the like may occur because of difference in stress between the gate insulating film and the protective layer or the like, and the fact that these layers are laminated, resulting in a reduced yield.

As a technical solution for this issue, for example, there is a method in which the film thickness of the gate insulating film is reduced to reduce the stress of the gate insulating film. However, when the thickness of the gate insulating film is reduced, the pressure resistance property may be deteriorated, or the insulation property between electrodes, such as between a gate electrode and source and drain electrodes or the like, may be deteriorated, and hence the reliability may be deteriorated. In addition, although the stress may also be reduced by decreasing the film density of the gate insulating film, this solution is not appropriate for a reason similar to that of the case of the above-mentioned reduction of the thickness of the gate insulating film.

In contrast, in the present embodiment, the first insulating film 14 is formed on the substrate 11 with the metal layer 13 including the gate electrode 13A, the capacitive electrode 13B, and the like formed in a part of a region on the substrate 11 in between, and the trench 14A is provided in a part or all of the metal layer unformed region A. Consequently, it is possible to reduce the stress of the first insulating film 14 without deteriorating the thickness and density of the first insulating film 14.

As described above, in the present embodiment, the trench 14A is provided in a part or all of the metal layer unformed region A of the first insulating film 14 provided on the substrate 11 with the metal layer 13 therebetween, so that the stress of the first insulating film 14 is allowed to be reduced. That is, the occurrence of film peel-off of the first insulating film 14 or the like from the substrate 11 is suppressed, and hence the yield is improved.

In addition, in the case where the trench 14A penetrates the first insulating film 14, since the laminate portion of the first insulating film 14 and the third insulating film 16 is decreased, it is possible to further suppress the occurrence of film peel-off of the first insulating film 14 from the substrate 11.

Figure 4A:
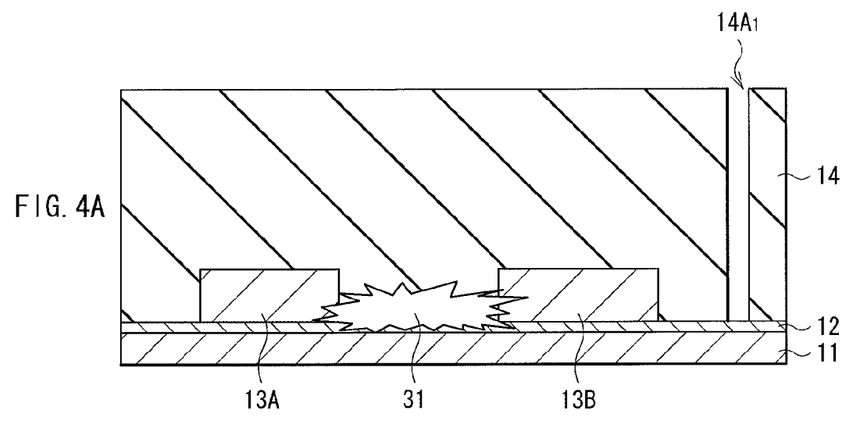
FIGS. 4A and 4B are sectional views for explaining an exemplary effect of the embodiment of the present disclosure.

Further, when the substrate 11 is a flexible substrate, foreign materials are likely to be mixed therein during a manufacturing process. For this reason, in the case where electrodes of the same metal layer (for example, in the present embodiment, the gate electrode 13A and capacitive electrode 13B) are to be formed by patterning based on a photolithography method, if, for example, foreign materials (particles) exist on a photoresist film or on a photomask (exposure mask) before exposing the photoresist film, it is difficult to form a desired pattern at the time of etching. For this reason, etching defect may occur, and disconnection of wiring, or short circuit (short) caused by foreign materials 31 shown in FIG. 4A may occur. As a result, a dotted defect or a linear defect may be caused in some cases, resulting in a reduced manufacture yield.

Figure 4B:
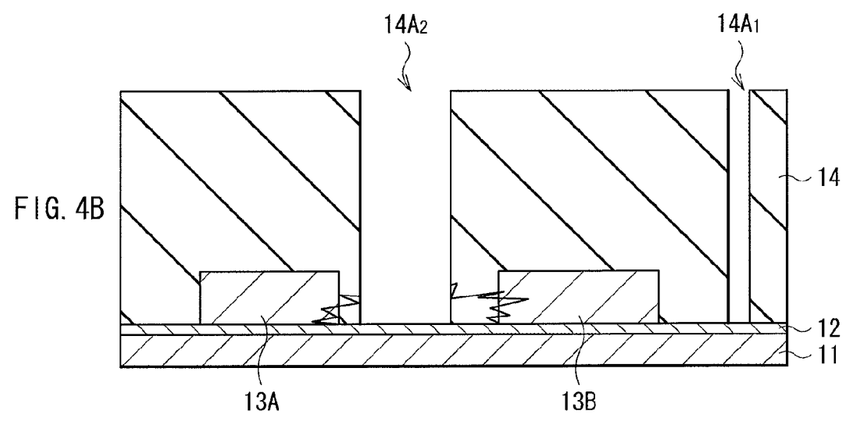

In contrast, since, in the present embodiment, the first insulating film 14 is provided with the trench 14A, and this trench 14A is a penetrating hole, it is possible to solve the issue of mixing of foreign materials. That is, in the case where the first insulating film 14 and foreign materials 31 are made of the same material, by the patterning of the first insulating film 14 at the time of forming the trench 14A, it is possible to remove the foreign materials 31 at the same time as the removal of the first insulating film 14, as shown in FIG. 4B. Consequently, it is possible to reduce a short circuit defect or the like which occurs between the gate electrode 13A and the capacitive electrode 13B, between wirings (not illustrated in FIGS. 4A and 4B), and, between a wiring (not illustrated in FIGS. 4A and 4B) and an electrode. Therefore, it is possible to improve the yield without increasing the number of process. In addition, even when the first insulating film 14 and the foreign material 31 are made of different materials from each other, it is possible to remove the foreign material 31 in a removing process of the first insulating film 14 by appropriately selecting the etching solution. Alternatively, it is also possible to remove the foreign material 31 by lengthening the exposure time.

(Modification 1)

Figure 5:
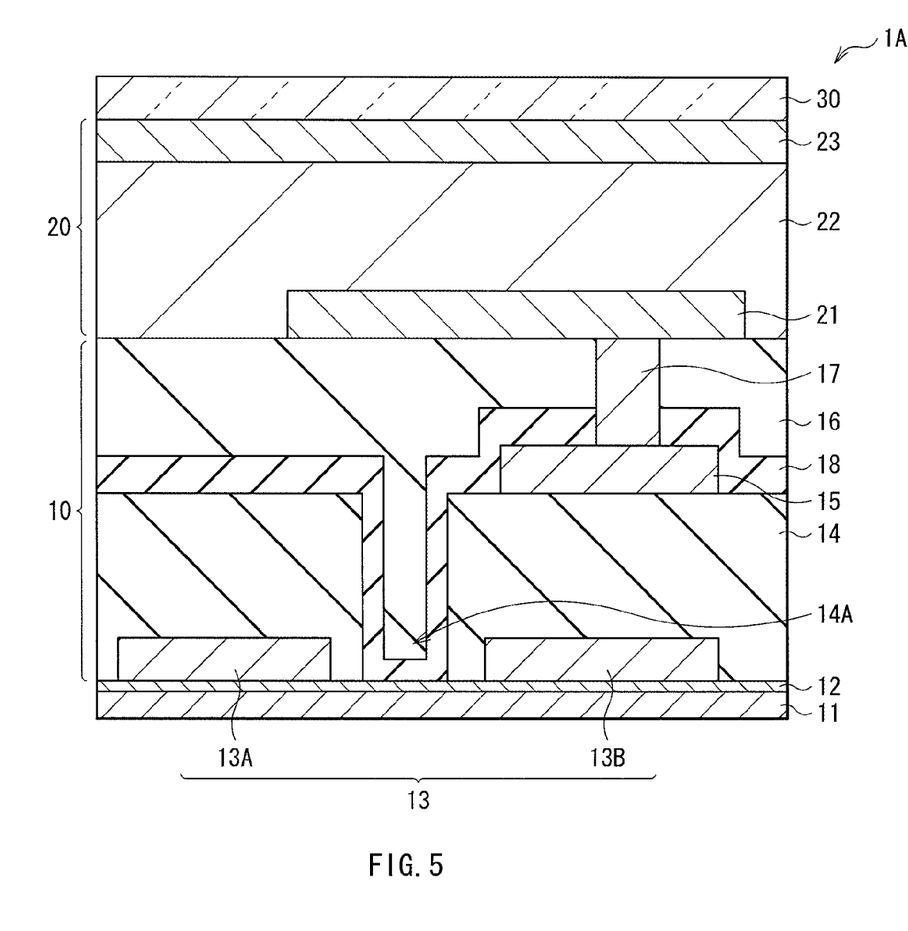
FIG. 5 is a sectional view illustrating a configuration of a display unit according to modification 1 of the embodiment of the present disclosure.

FIG. 5 illustrates a cross-sectional configuration of a display unit 1A according to modification 1. In this display unit 1A, the second insulating film 18 is provided between the first insulating film 14 and the third insulating film 16 all over the intersurface thereof. Except for this point, the display unit 1A has a similar configuration to that of the display unit 1 of the above-mentioned embodiment, and the function and effect thereof are similar to those of the display unit 1.

The second insulating film 18 of the present modification is provided over the entire face of the substrate 11. Consequently, the manufacturing process is simplified, and the effect of the barrier layer 12 is strengthened. As is the case in the above-mentioned embodiment, the second insulating film 18 is configured of, for example, a single-layer film made of one of $SiO_2$, $Si_3N_4$, SiNO, $Al_2O_3$, and the like, or a laminated film made of two or more of these materials. The thickness of the second insulating film 18 is, for example, 50 to 350 nm, but this is not limitative. In addition, the material of the second insulating film 18 is not limited to the above-mentioned inorganic materials, and organic materials such as PVA (polyvinyl alcohol), PVP (polyvinyl phenol), a novolac resin, an acrylic resin, and a fluorine-based resin may be used.

The third insulating film 16 is made of a polyimide resin or an acrylic resin, and desirably has photosensitivity. With this, the insulation distance between the pixel electrode 21 and the gate wiring or the source wiring is increased, and hence parasitic capacitance is decreased. Consequently, it is possible to dispose end portions of the pixel electrode 21 in a stacked manner above the gate wiring and the source wiring. That is, it is possible to widen the effective planar dimension of the pixel electrode 21. Although the film thickness of the third insulating film 16 is not specifically limited, 1 μm to 3 μm or so is preferable. With this, it is possible to planarize the unevenness caused by the TFT, the gate wiring, and the source wiring. It is to be noted that the material of the third insulating film 16 is not limited to the above-mentioned organic materials. The material of the third insulating film 16 may also be an inorganic material such as $SiO_2$, $Si_3N_4$, SiNO, and $Al_2O_3$, and the third insulating film 16 may be configured of a single-layer film made of one of these materials, or a laminated film made of two or more of these materials.

It is to be noted that, the trench 14A described in the above-mentioned first embodiment is filled with the second insulating film 18 and the third insulating film 16 as shown in FIG. 5, but this is not limitative. Alternatively, the trench 14A may be filled only with the second insulating film 18.

In the display unit 1A of the present modification, the second insulating film 18 is provided between the first insulating film 14 having the trench 14A and the third insulating film 16, and therefore, in addition to the effect of the above-mentioned embodiment, an effect that interference between the pixel electrode 21 and the gate wiring or the signal line etc. is suppressed is obtained. Consequently, it is possible to increase the planar dimension of the pixel electrode 21. In addition, when the pixel electrode 21 is made of a nontransparent metal, it is possible to shield light irradiated to the semiconductor layer, and suppress degradation of characteristics of the TFT due to photoelectric effect or the like.

(Modification 2)

Figure 6:
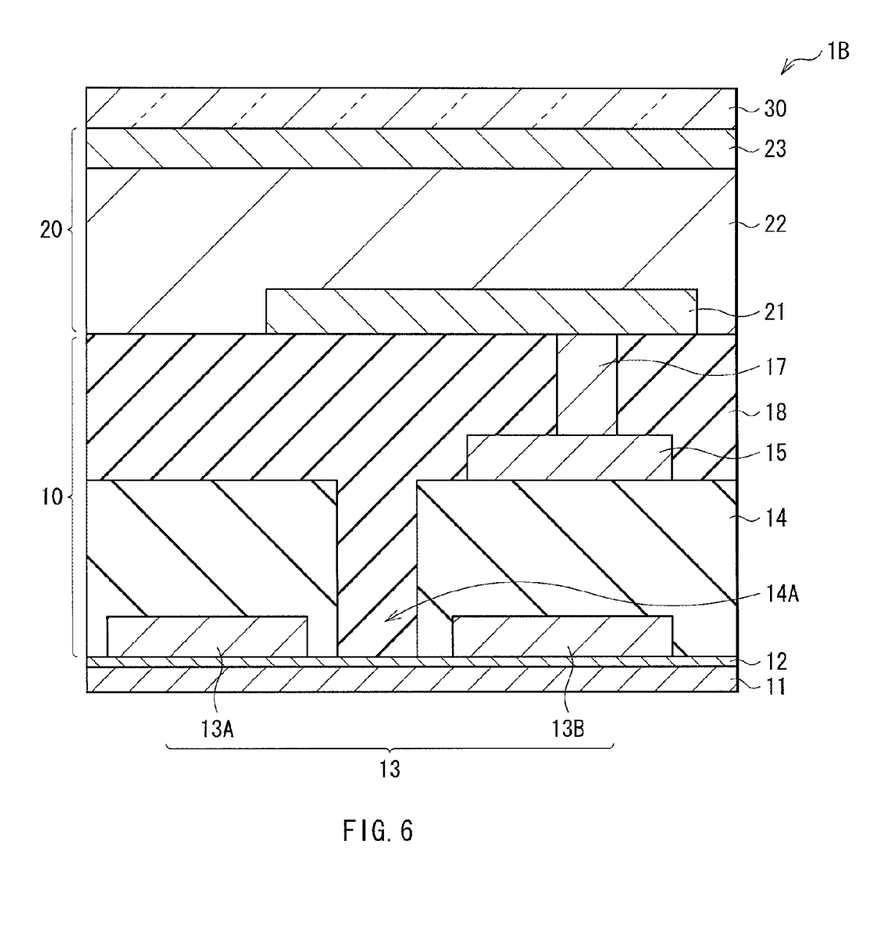
FIG. 6 is a sectional view illustrating a configuration of a display unit according to modification 2 of the embodiment of the present disclosure.

FIG. 6 illustrates a cross-sectional configuration of a display unit 1B according to modification 2. This display unit 1B is different from the display unit 1A of the above-mentioned modification 1 in that the second insulating film 18 is provided on the first insulating film 14, and the display layer 20 is directly provided on the second insulating film 18. Except for this point, the display unit 1B has a similar configuration as the display unit 1A of the above-mentioned modification 1, and the function and effect thereof are similar to those of the display unit 1A.

While the second insulating film 18 is made of the same material as the third insulating film 16 of the above-mentioned modification 1, the film thickness thereof is desirably 100 nm to 500 nm. It is to be noted that, it is preferable that the thickness of the second insulating film 18 of the present modification be greater than that of the second insulating film 18 of the above-mentioned embodiment and the modification 1. With this configuration, it is possible to reduce the parasitic capacitance associated with the pixel electrode 21.

The display unit of the embodiment of the present technology may be applied to various kinds of electronic apparatus, and the kind of electronic apparatus is not specifically limited. For example, the display unit may be incorporated in the electronic apparatus described below. It should be noted that, the configuration of the electronic apparatus described below is merely an example, and the configuration thereof may be appropriately changed.

Figure 7A:
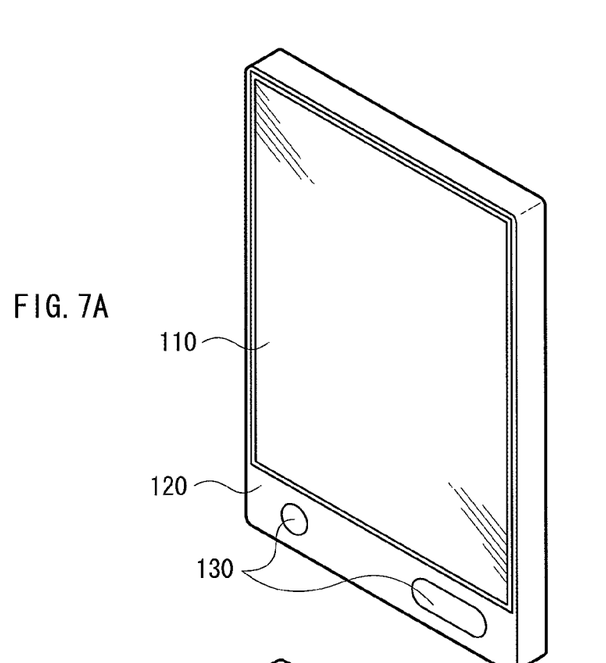
FIG. 7A is a perspective view illustrating an example of an external appearance of application example 1.
Figure 7B:
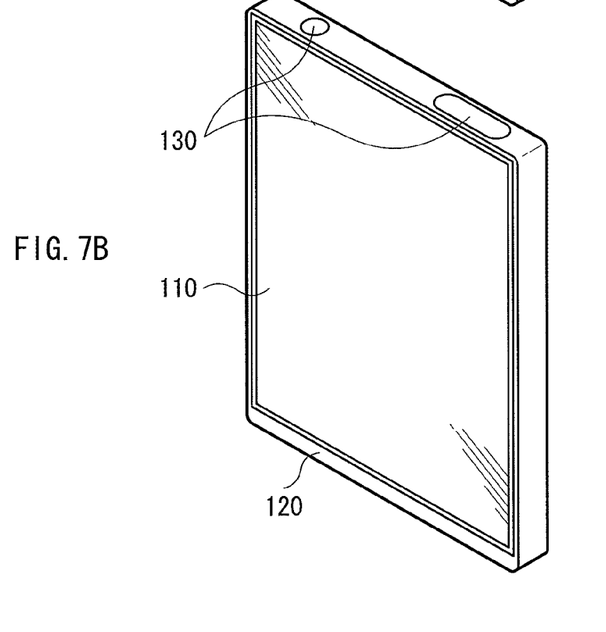
FIG. 7B is a perspective view illustrating another example of an external appearance of application example 1.

FIGS. 7A and 7B illustrate external appearances of an electronic book. This electronic book includes a display section 110, a non-display section 120, and an operation section 130, for example. It is to be noted that, the operation section 130 may be provided either on the front face of the non-display section 120 (housing) as shown in FIG. 7A, or on the top face as shown in FIG. 7B. It is to be noted that, the display unit of the embodiment of the present technology may be incorporated in a PDA or the like having a configuration similar to that of the electronic book shown in FIGS. 7A and 7B.

Figure 8:
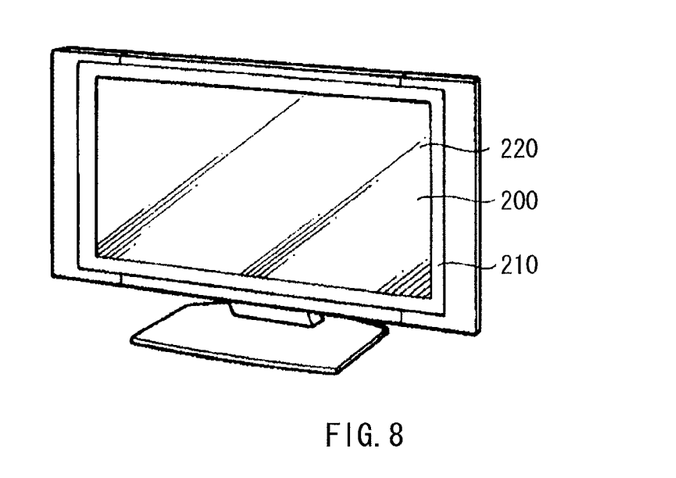
FIG. 8 is a perspective view illustrating an external appearance of application example 2.

FIG. 8 illustrates an external appearance of a television. For example, this television is provided with an image display screen section 200 including a front panel 210 and a filter glass 220.

Figure 9A:
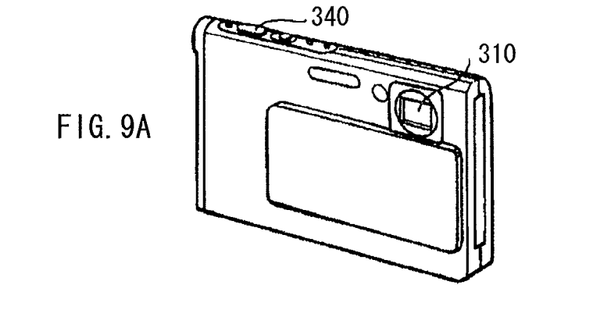
FIG. 9A is a perspective view illustrating an external appearance of application example 3 as seen from the front side.
Figure 9B:
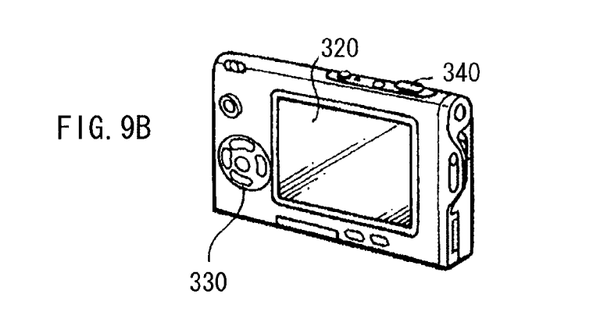
FIG. 9B is a perspective view illustrating the external appearance of application example 3 as seen from the back side.

FIGS. 9A and 9B illustrate external appearances of a digital still camera, and show the front face thereof and the rear face thereof, respectively. This digital still camera includes a light emission section 310 that generates flash light, a display section 320, a menu switch 330, and a shutter button 340, for example.

Figure 10:
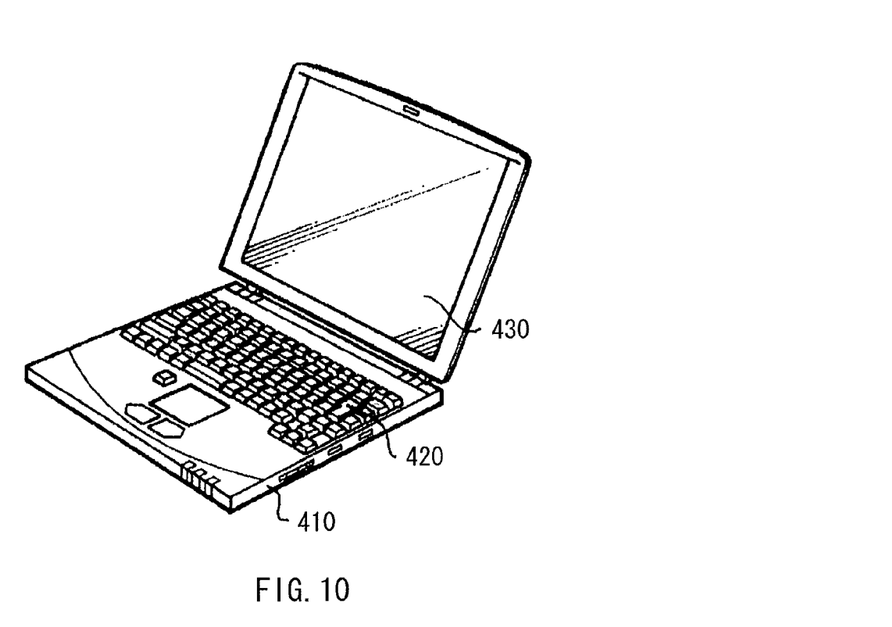
FIG. 10 is a perspective view illustrating an external appearance of application example 4.

FIG. 10 illustrates an external appearance of a notebook personal computer. This notebook personal computer includes a main body 410, a keyboard 420 for inputting letters or the like, and a display section 430 on which an image is displayed, for example.

Figure 11:
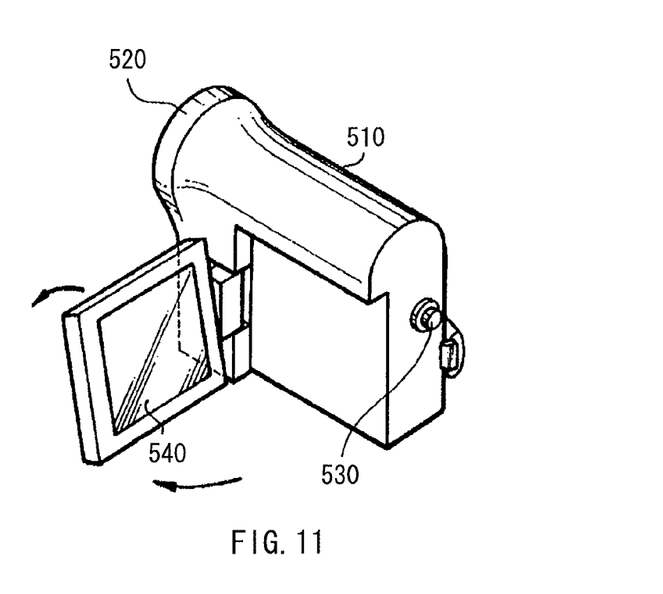
FIG. 11 is a perspective view illustrating an external appearance of application example 5.

FIG. 11 illustrates an external appearance of a video camcorder. This video camcorder includes a main body section 510, a lens 520 which is configured to take an image of a subject and provided on the front side of the main body section 510, a start/stop switch 530 which is used when capturing an image, and a display section 540, for example.

Figures 12A, 12B:
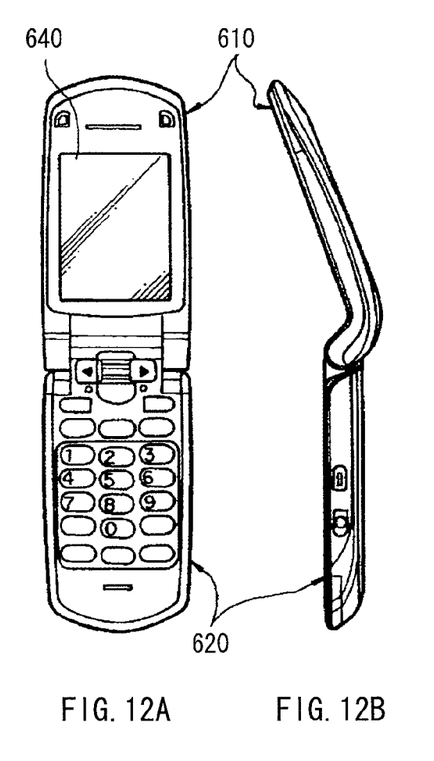
FIG. 12A is a front elevational view of application example 6 in an unfolded state.
FIG. 12B is a side view thereof.
Figures 12C, 12D, 12E, 12G:
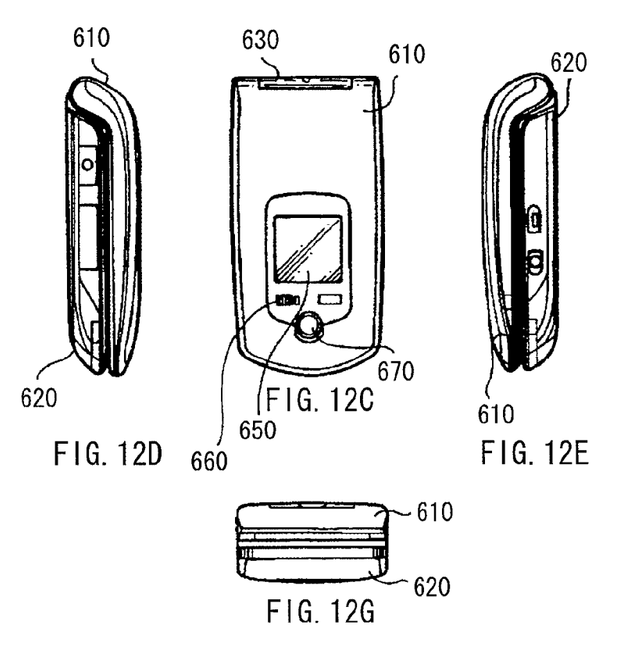
FIG. 12C is a front elevational view in a folded state.
FIG. 12D is a left-side view.
FIG. 12E is a right-side view.
FIG. 12G is a bottom view.
Figure 12F:
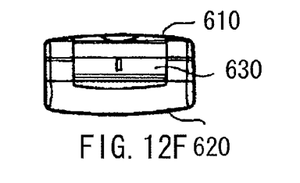
FIG. 12F is a top view.

FIGS. 12A to 12G illustrate an external appearance of a mobile phone. FIGS. 12A and 12B respectively show the front face and side face of the mobile phone in an unfolded state. FIGS. 12C to 12G respectively show the front face, left side face, right side face, top face, and bottom face of the mobile phone in a folded state. This mobile phone has an upper side housing 610 and a lower side housing 620 which are connected by a connecting section (hinge section) 630, and includes a display 640, a sub-display 650, a picture light 660, and a camera 670, for example.

Hereinabove, while the present technology is described based on the embodiment and modifications, the present technology is not limited to the above-mentioned embodiment and so forth, and various modifications may be made. For example, while the electrophoretic display in which the display layer 20 which contains electrophoretic particles is provided between the pixel electrode and the common electrode is described in the embodiment and so forth, a liquid crystal layer, an organic EL (Electro-Luminescence) layer, an inorganic EL layer, or the like may also be adopted as the display layer 20.

In addition, the material and the thickness of each layer, and the film formation method, the film formation condition, and the like described in the embodiment and so forth are not limitative, and other materials, thickness, film formation methods, and film formation conditions may be adopted. For example, the film property of the first insulating film 14 and that of the second insulating film 18 may be similar to each other, and the film property of the first insulating film 14 and that of the second insulating film 18 may be exchanged.

Further, while the configuration of the display unit 1 is described in detail in the embodiment and so forth, it is not necessary to include all of the layers, and it is possible to include other layers.

It is possible to achieve at least the following configurations from the above-described example embodiments and the modifications of the disclosure.

(1) A device including:
  a substrate;
  a metal layer being formed in a region on a part of the substrate; and
  a first insulating film being provided on the substrate and the metal layer and including a trench provided at a position corresponding to a part or all of a region where the metal layer is not provided.

(2) The device according to (1), wherein the trench is filled with a third insulating film formed on the first insulating film.

(3) The device according to (1) or (2), wherein a side face of the metal layer is covered by the first insulating film.

(4) The device according to any one of (1) to (3), wherein the trench penetrates the first insulating film in a laminating direction thereof.

(5) The device according to any one of (2) to (4) further including:
  a second insulating film being provided between the first insulating film and the third insulating film, wherein the trench is filled with the second insulating film or both of the second insulating film and the third insulating film.
(6) The device according to any one of (1) to (5), wherein the metal layer is configured of a wiring or an electrode of a thin film transistor or of a capacitive element.
(7) The device according to any one of (1) to (6), wherein the substrate has flexibility.
(8) A display unit including:
  a device; and
  a display layer, the device and the display layer being provided above a substrate, wherein the device includes
    a metal layer being formed in a region on a part of the substrate, and
    a first insulating film being provided on the substrate and the metal layer and including a trench provided at a position corresponding to a part or all of a region where the metal layer is not provided.
(9) The display unit according to (8), wherein the display layer includes an electrophoretic layer between a pair of electrodes.
(10) The display unit according to (8), wherein the display layer includes a liquid crystal layer between a pair of electrodes.
(11) The display unit according to (8), wherein the display layer includes an organic EL layer between a pair of electrodes.
(12) The display unit according to (8), wherein the display layer includes an inorganic EL layer between a pair of electrodes.

The present disclosure contains subject matter related to that disclosed in Japanese Priority Patent Application JP 2011-112315 filed in the Japan Patent Office on May 19, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A device comprising:
  a substrate;
  a metal layer, wherein the metal layer is formed in a first region of the substrate;
  a first insulating film, wherein the first insulating film covers a lateral face and a side face of the metal layer, wherein a trench is formed in the first insulating film at a second region of the substrate where the metal layer is not formed, and wherein the trench penetrates the first insulating film to a depth equal to the thickness of the first insulating film;
  a second insulating film, wherein at least a first region of the trench is filled with the second insulating film; and
  a third insulating film, wherein the third insulating film is provided between the first insulating film and the second insulating film.

2. The device according to claim 1, wherein the trench penetrates the first insulating film in a laminating direction thereof.

3. The device according to claim 1, wherein the substrate is flexible.

4. A display unit comprising:
  a device; and
  a display layer, wherein the device and the display layer are provided above a substrate, and wherein the device comprises:
    a metal layer, wherein the metal layer is formed in a first region of the substrate,
    a first insulating film, wherein the first insulating film covers a lateral face and a side face of the metal layer, wherein a trench is formed in the first insulating film at a second region of the substrate where the metal layer is not formed, and wherein the trench penetrates the first insulating film to a depth equal to the thickness of the first insulating film,
    a second insulating film, wherein at least a first region of the trench is filled with the second insulating film, and
    a third insulating film, wherein the third insulating film is provided between the first insulating film and the second insulating film.

5. The display unit according to claim 4, wherein the display layer comprises an electrophoretic layer between a pair of electrodes.

6. The display unit according to claim 4, wherein the display layer comprises a liquid crystal layer between a pair of electrodes.

7. The display unit according to claim 4, wherein the display layer comprises an organic EL layer between a pair of electrodes.

8. The display unit according to claim 4, wherein the display layer comprises an inorganic EL layer between a pair of electrodes.

9. The device according to claim 1, wherein the metal layer comprises a transistor gate electrode and wherein the first insulating film is in contact with the transistor gate electrode.

10. The device according to claim 1, wherein the metal layer comprises a capacitor electrode and wherein the first insulating film is in contact with the capacitor electrode.

11. The display unit according to claim 4, wherein the metal layer comprises a transistor gate electrode and wherein the first insulating film is in contact with the transistor gate electrode.

12. The display unit according to claim 4, wherein the metal layer comprises a capacitor electrode and wherein the first insulating film is in contact with the capacitor electrode.

* * * * *